(12) United States Patent
Hallak

(10) Patent No.: US 8,705,255 B2
(45) Date of Patent: Apr. 22, 2014

(54) METHOD FOR MEASURING AN ALTERNATING CURRENT WHICH IS GENERATED USING INVERTERS, AND ARRANGEMENT FOR CARRYING OUT THE METHOD

(75) Inventor: Jalal Hallak, Vienna (AT)

(73) Assignee: Siemens Aktiengesellschaft, Munich (DE)

( * ) Notice: Subject to any disclaimer, the term of this patent is extended or adjusted under 35 U.S.C. 154(b) by 1169 days.

(21) Appl. No.: 12/226,172

(22) PCT Filed: Mar. 29, 2007

(86) PCT No.: PCT/EP2007/053019
§ 371 (c)(1),
(2), (4) Date: Oct. 9, 2008

(87) PCT Pub. No.: WO2007/118779
PCT Pub. Date: Oct. 25, 2007

(65) Prior Publication Data
US 2009/0189575 A1    Jul. 30, 2009

(30) Foreign Application Priority Data
Apr. 13, 2006 (DE) .......................... 10 2006 017 479

(51) Int. Cl.
*H02M 7/42* (2006.01)

(52) U.S. Cl.
USPC .............................. 363/95; 363/131; 320/120

(58) Field of Classification Search
USPC ........... 323/285; 324/120, 12 R, 130; 363/79, 363/95, 97, 131, 178
See application file for complete search history.

(56) References Cited

U.S. PATENT DOCUMENTS 3,739,274 A * 6/1973 DePuy ........................... 324/120
5,001,622 A * 3/1991 Kirchberg et al. .............. 363/95

(Continued)

FOREIGN PATENT DOCUMENTS

DE    195 35 271 A1    3/1997
DE    199 05 271 A1    8/2000

(Continued)

OTHER PUBLICATIONS

Machine translation of DE 102004041766. Obtained on Jul. 23, 2012 at http://worldwide.espacenet.com/?locale=en_EP.*

(Continued)

*Primary Examiner* — Adolf Berhane
*Assistant Examiner* — Fred E Finch, III

(57) ABSTRACT

There is described a method for measuring an alternating current which is generated using inverters and is fed into an AC power system, wherein a zero crossing signal of the AC power system is predefined, and wherein, triggered by the zero crossing signal, the measured alternating current is periodically adjusted in such a manner that an adjustment value which is assigned to the zero crossing signal is predefined, a measured value which is assigned to the zero crossing signal being adapted to said adjustment value. This method makes it possible for the measurement signal detected by a measuring circuit to be periodically adjusted using an adjustment value even during operation.

16 Claims, 2 Drawing Sheets

(56) References Cited

U.S. PATENT DOCUMENTS

| | | | |
|---|---|---|---|
| 5,644,463 A * | 7/1997 | El-Sharkawi et al. | 361/94 |
| 5,850,132 A * | 12/1998 | Garces | 318/599 |
| 6,285,572 B1 * | 9/2001 | Onizuka et al. | 363/72 |
| 6,339,538 B1 * | 1/2002 | Handleman | 363/95 |
| 2004/0264089 A1 * | 12/2004 | Furuya et al. | 361/92 |
| 2006/0034106 A1 * | 2/2006 | Johnson | 363/97 |
| 2006/0193158 A1 * | 8/2006 | Fukaya et al. | 363/132 |

FOREIGN PATENT DOCUMENTS

| | | | | |
|---|---|---|---|---|
| DE | 10 2004 041 766 A1 | 3/2006 | | |
| JP | 63157676 A | 6/1988 | | |
| JP | 2003121479 A | 4/2003 | | |
| JP | 2004289971 A * | 10/2004 | | H02P 7/63 |

OTHER PUBLICATIONS

Kaplan, D. M. & White, C. G. (2003). "Hands-on electronics: A practical introduction to analog and digital circuits", pp. 95-97. Cambridge, UK: Cambridge University Press.*

Machine translation of JP 2004-289971A, Oct. 2004. Obtained from http://dossier1.ipdl.inpit.go.jp/AIPN/odse_top_dn.ipdl?N0000=7400 on Dec. 5, 2013.*

Soter, S. et al., "Adjustable Converter for Injection of Fuel Cell Power as a Part of a Virtual Power Plant" in 35th Annual IEEE Power Electronics Specialists Conference, Aachen, 2004, pp. 1988-1990; Stefan Soter, University of Dortmund, Dortmund Germany, Frank Bertling University of Dortmund, Dortmund Germany.

Communication from Sonderhoff & Einsel, Jul. 21, 2011, pp. 1, 1-6, 1-2.

* cited by examiner

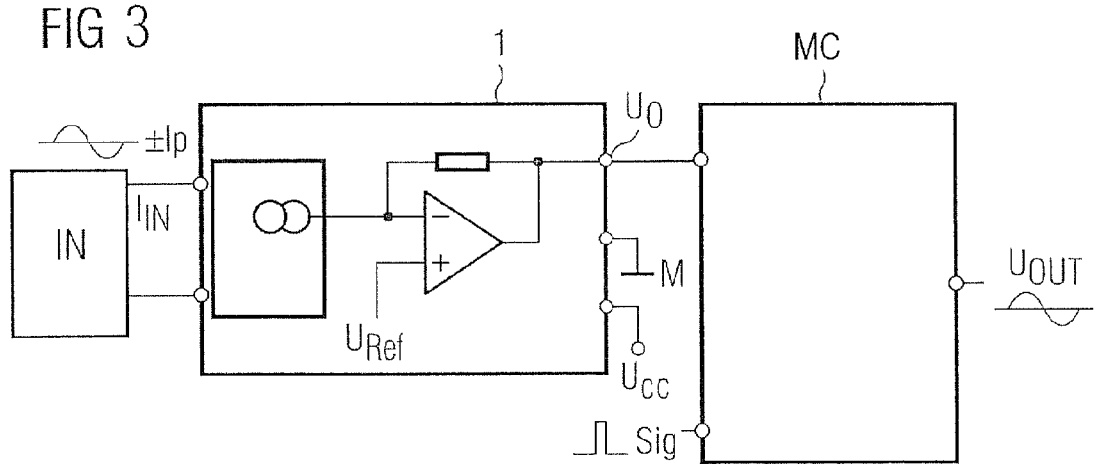

METHOD FOR MEASURING AN ALTERNATING CURRENT WHICH IS GENERATED USING INVERTERS, AND ARRANGEMENT FOR CARRYING OUT THE METHOD

CROSS REFERENCE TO RELATED APPLICATIONS

This application is the US National Stage of International Application No. PCT/EP2007/053019, filed Mar. 29, 2007 and claims the benefit thereof. The International Application claims the benefits of German application No. 10 2006 017 479.8 DE filed Apr. 13, 2006, both of the applications are incorporated by reference herein in their entirety.

FIELD OF INVENTION

The present invention relates to a method for measuring an alternating current which is generated using inverters and which is fed into an AC power system, wherein a zero crossing signal of the AC power system is predefined. The invention also relates to an arrangement for carrying out the method.

BACKGROUND OF INVENTION

Inverters are conventionally used to transform energy from direct current sources into alternating currents and to feed them into AC power systems or to loads. The voltage waveform and the phase angle are matched to the alternating current in the power system so that direct current components and phase shifts are minimized. This is important, above all, in the case of public power supply systems, since in this case, precise feed guidelines are predefined by the network operators, with maximum permissible direct current components.

In order to be able to regulate the inverter suitably, zero crossing in the power system is continually detected and is predefined as a zero crossing signal. Additionally, at the output of the inverter, the alternating current is measured as a controlled variable. Inaccuracies resulting from components can arise in the measuring circuits used, which include, for example, shunt resistors or current transformers. These can be, for example, an unwanted offset voltage in current transformers, or a temperature drift. Methods are therefore known from the prior art by means of which measuring circuits are adjusted.

One method consists, for example, in manually adjusting each measuring circuit after its production. Other methods make use of microcontrollers which perform an adjustment procedure after each switching-on of the device.

In measuring circuits which use shunt resistors to detect the current, the losses which occur at the shunt resistors must be taken into account.

According to the prior art, therefore, in the case of inverters of high output, the use of current transformers is provided in order to measure the current at the output of the inverter. With these current transformers, in order to eliminate unwanted offset voltages, methods with manual adjustment during production are used. However, a method is also known wherein a microcontroller integrated into the measuring circuit is used for adjusting the current transformer at every switching-on of the device.

However, with this method, no deviations due to temperature drift or residual magnetism of the current transformer core are rectified. Residual magnetism is caused by changes in the current direction, due to hysteresis effects in the current transformer core. Heat generated during operation, or external temperature changes, lead to temperature drift, which means that inaccuracies caused by temperature-dependent properties of the current transformer components arise in the current transformer.

SUMMARY OF INVENTION

It is an object of the invention, using a method of the type described in the introduction, to provide an improvement over the prior art. It is a further object of the invention to provide an arrangement for carrying out the method.

This object is achieved with a method for measuring an alternating current which is generated using inverters and which is fed into an AC power system, wherein a zero crossing signal of the AC power system is predefined, wherein, triggered by the zero crossing signal, the measured alternating current is periodically adjusted in such a manner that an adjustment value that is assigned to the zero crossing signal is predefined, a measured value which is assigned to the zero crossing signal in the same manner being adapted to said adjustment value.

This method also enables periodic adjustment, with an adjustment value, of the measurement signal detected with a measuring circuit, during operation. The adjustment is controlled by means of the zero crossing signal of the AC power system. By this means, it is achieved that the adjustment is carried out synchronously with the AC power system and also that deviations due to temperature drift or residual magnetism are compensated for.

In an advantageous embodiment, an adjustment value equal to zero Ampere is assigned to each zero crossing of the power system current and each measured value detected at the zero crossing of the power system current is adapted to this adjustment value. The adjustment is then carried out at each zero crossing of the power system. Fixing of the adjustment value at zero Ampere also has the effect that the current measured at the output of the inverter is measured without any direct current component caused by inaccuracies. An accurate measurement output signal is therefore made available for the regulation of the inverter, so that feeding into the AC power system takes place synchronously with the power system current and without direct current components.

Adjustment during zero crossing also uses a particular type of alternating current generated by the inverters. During reversal of the current direction, the current value remains constant for the duration of the reversing procedure. This duration is used for adjusting the measurement signal.

It is also advantageous if, at each adjustment, a correction value is determined from the adjustment value and the detected measured value and if, until the next adjustment, the measurement signal corrected with the correction value is output as the measurement output signal. This represents a simple method for adjustment of the measurement signal, and can be carried out either by means of a discrete circuit or by means of a microcontroller.

For an AC power system without phase shifting, that is without a reactive current component, it is advantageous to adjust the measured values with the adjustment value at the time points of the zero crossings. Feeding into the AC power system then takes place synchronously with the zero crossing signal without any direct current components.

When the current generated by an inverter is fed into a separate network, a phase shift usually takes place between the power system voltage and the power system current due to non-correctable impedances. The measured values are then advantageously adjusted with the adjustment value at the time points of the zero crossing of the power system current.

It is herein favorable to determine the time points of the zero crossings of the power system current by detecting the power system voltage and the phase shift, since detection of the power system voltage is, in any event, required within the inverter arrangement as a fixed point for the current feed.

The problem is also solved with an arrangement which is configured to carry out the claimed method, wherein a current transformer is provided for measuring the alternating current and wherein the alternating current generated by the inverter is applied to the input of the current transformer and wherein a voltage exists at the output as the measurement signal and wherein the measurement signal is periodically adapted to the adjustment value, depending on the zero crossing signal. The continually adjusted current transformer operates almost loss-free, so that the overall efficiency of the inverter is improved compared with measuring circuits having a shunt resistor.

In an advantageous embodiment of the arrangement, a microcontroller with at least two inputs is provided, wherein the measurement signal generated by the current transformer is applied to a first input and the zero crossing signal is applied to a second input and wherein, furthermore, a voltage value from the current transformer and assigned to the current value of zero Ampere is predefined for the microcontroller as the adjustment value and wherein, at an output of the microcontroller, a measurement output signal corrected with the correction value can be tapped off. The use of the microcontroller permits a simple arrangement which is easily adapted to different inverters with different current transformers.

Depending on the number of items to be produced, it may also be advantageous if a Sample and Hold amplifier is provided, the measurement signal from the current transformer and the zero crossing signal being applied to the inputs of said Sample and Hold amplifier, and if a correction value is applied as the output signal, said correction value being fed to the positive input of an operational amplifier and if, in addition, the measurement signal is applied to the negative input of the operational amplifier, so that the corrected measurement output signal can be tapped off at the output of the operational amplifier. With this circuit constructed with discrete components, no microcontroller is needed.

BRIEF DESCRIPTION OF THE DRAWINGS

The invention will now be described in greater detail using exemplary embodiments and by reference to the drawings, in which:

FIG. 3 shows a further arrangement for adjustment of the measurement signal $U_0$.

DETAILED DESCRIPTION OF INVENTION

Figure 1:
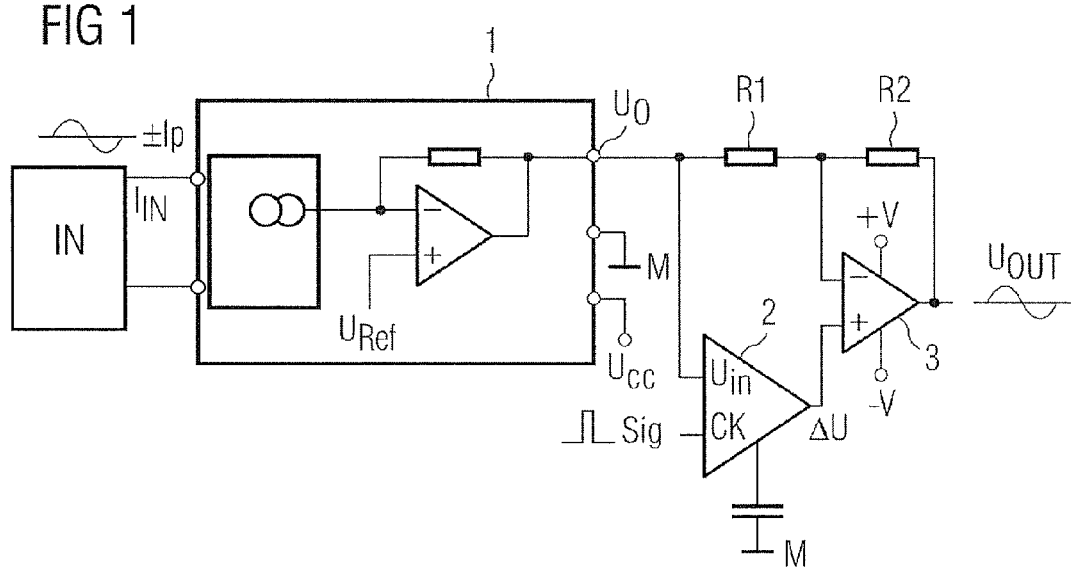
FIG. 1 shows an arrangement for adjustment of the measurement signal $U_0$ by means of discrete components.

FIG. 1 shows an arrangement for measuring an alternating current ±Ip generated by an inverter IN ($I_{IN}$) by means of a power converter 1. The measurement signal $U_0$ at the output of the power converter 1 is connected to the input $U_{IN}$ of a so-called Sample and Hold amplifier 2. The zero crossing signal Sig is applied to the time generator input CK of the Sample and Hold amplifier 2. In addition, the Sample and Hold amplifier 2 is connected via a capacitor to a frame potential M as the reference potential. The output of the Sample and Hold amplifier 2 is connected to the positive input of an operational amplifier 3. This is supplied with a positive and negative potential +V, −V. The measurement signal $U_0$ output by the current transformer 1 is applied via a first resistor R1 at the negative input of the operational amplifier 3. The output of the operational amplifier 3 is connected via a further resistor R2 to the negative input, so that a difference amplifier is produced.

The current transformer 1 is connected to a supply voltage $U_{CC}$ and the frame potential M. The usually annular current transformer core surrounds a line through which the alternating current to be measured flows. The magnetic flux produced by the alternating current variation in the current transformer core is detected by a Hall effect sensor and converted into an equivalent voltage variation. This voltage variation is amplified by means of an operational amplifier configured as a difference amplifier, wherein a reference voltage $U_{REF}$ determines the level of the voltage which corresponds to zero Ampere at the input. What then exists at the output of the current transformer is the, as yet, unadjusted variation of the measurement signal $U_0$.

In the embodiment shown in FIG. 1 with discrete components, adjustment takes place in such a manner that, initially, a correction value $\Delta U$ is formed in the Sample and Hold amplifier 2. For this purpose, the measurement signal $U_0$ applied to the input $U_{IN}$ is held on every pulse of the zero crossing signal Sig which is applied to the time generator CK. The resulting voltage value against frame potential M then exists at the output of the Sample and Hold amplifier as a correction value $\Delta U$ until the next pulse from the zero crossing signal Sig.

This correction value $\Delta U$ is therefore also applied to the positive input of the operational amplifier 3. The measurement signal $U_0$ applied via the first resistor R1 to the negative input then produces the adjusted measurement output signal $U_{OUT}$ at the output of the operational amplifier. The resistors R1 and R2 should be chosen so that with zero Ampere at the input of the current transformer, the measurement signal $U_0$ corresponds to the reference voltage $U_{REF}$ of the current transformer.

As an alternative, a microcontroller can also be arranged in place of the circuit with the Sample and Hold amplifier and an operational amplifier connected downstream thereof. FIG. 3 shows such an arrangement, wherein the microcontroller MC has at least two inputs and one output, wherein the measurement signal $U_0$ is applied to the first input and the zero crossing signal Sig is applied to the second input. With each pulse of the zero crossing signal Sig, the microcontroller MC stores the instantaneous value of the measurement signal $U_0$ as the correction value $\Delta U$ until the next pulse. The microcontroller MC then calculates the adjusted measurement output signal $U_{OUT}$ in such a manner that the correction value $\Delta U$ is subtracted from the measurement signal $U_0$. The adjusted measurement output signal $U_{OUT}$ can be tapped off at the output of the microcontroller MC.

Figure 2:
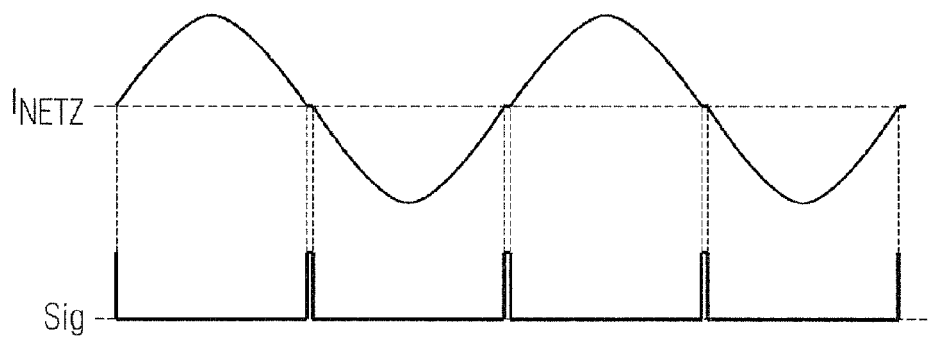
FIG. 2 shows the signal shape of the current $I_{NETZ}$ in the AC power system and the derived zero crossing signal Sig.

FIG. 2 shows the variation over time of the power system current $I_{NETZ}$ and the zero crossing signal Sig derived therefrom. The zero crossing signal Sig has an essentially rectangular pulse at the zero crossing points of the power system current $I_{NETZ}$, wherein the pulse duration corresponds to the time period which is needed by the switching-over process of the switching elements in the inverter in order to reverse the direction of current flow. This zero crossing signal Sig is then either fed to the Sample and Hold amplifier with a discrete component arrangement or to the microprocessor. In the case of public power networks without any phase shift between the current and the voltage, by this means, the power supply voltage can be used to derive the zero crossing signal, rather than the power supply current.

In the event that, for example, a separate network in which there are impedances with non-adjustable capacitive or inductive components is being fed, the power supply current leads or lags behind the power supply voltage. In that case, the zero crossing signal Sig is taken directly from the zero crossings of the power supply current. Since, however, the power supply voltage is already continually detected in the case of inverters provided for feeding into power supply systems, the zero crossing signal Sig can also be formed from the zero crossings of the power system voltage after correction for the phase shift.

The invention claimed is:

1. A method for measuring an alternating current generated by an inverter, wherein the alternating current is fed into an AC mains power system, comprising:
    providing a zero crossing signal of the AC mains power system;
    generating an alternating current by the inverter;
    supplying, in a current transformer, a measured signal of the generated alternating current to a controller of the inverter for a synchronous feeding of the generated alternating current into the AC mains power system;
    adjusting the measured signal during a plurality of adjustment periods, triggered by the zero crossing signal, such that an adjustment value that is assigned to the zero crossing signal is predefined, and the measured signal is adjusted to the adjustment value at the beginning of each adjustment period.

2. The method as claimed in claim 1, wherein the adjustment value is equal to zero Ampere and is assigned to each zero crossing of a current of the AC mains power system, and wherein each measured value detected at the zero crossing of the AC mains power system current is adapted to the adjustment value.

3. The method as claimed in claim 2, wherein at each adjustment a correction value is based upon the adjustment value and the detected measured value, and wherein until a next adjustment, a measurement signal corrected with the correction value is output as a measurement output signal.

4. The method as claimed in claim 2, wherein in an the AC mains power system is without any phase shift and wherein the measured values are adjusted with the adjustment value at the time points of the zero crossings.

5. The method as claimed in claim 1, wherein at each adjustment a correction value is based upon the adjustment value and the detected measured value, and wherein until a next adjustment, a measurement signal corrected with the correction value is output as a measurement output signal.

6. The method as claimed in claim 5, wherein in an the AC mains power system is without any phase shift and wherein the measured values are adjusted with the adjustment value at the time points of the zero crossings.

7. The method as claimed in claim 1, wherein the AC mains power system is without any phase shift and wherein the measured values are adjusted with the adjustment value at the time points of the zero crossings.

8. The method as claimed in claim 1, wherein the AC mains power system is a separate power net with phase shifting and wherein the measured values are adjusted with the adjustment value at the time points of the zero crossings of a power system current.

9. The method as claimed in claim 8, wherein the time points of the zero crossings of the power system current are determined by detecting a power system voltage and the phase shift.

10. The method as claimed in claim 1, wherein the feeding of DC current components, which disturb the quality of the AC mains power system, is prevented.

11. A measuring device comprising:
    a current transformer for measuring an alternating current, wherein the alternating current generated by an inverter is applied to the input of the current transformer, and wherein the alternating current is fed into an AC mains power system; and
    an output for a voltage as a measurement signal, wherein the measurement signal is adjusted, during a plurality of adjustment periods, to an adjustment value based upon a zero crossing signal of the AC mains power system at the beginning of each adjustment periods,
    wherein the measurement signal is supplied to a controller of the inverter for a synchronous feeding of the alternating current into the AC mains power system.

12. The measuring device as claimed in claim 11, further comprising a microcontroller with a first input and a second input, wherein the measurement signal generated by the current transformer is applied to the first input and the zero crossing signal is applied to the second input, and wherein a voltage value from the current transformer and assigned to the current value of zero Ampere is predefined for the microcontroller as the adjustment value.

13. The measuring device as claimed in claim 12, wherein a measurement output signal corrected with a correction value is tapped off at an output of the microcontroller.

14. The measuring device as claimed in claim 11, further comprising a Sample and Hold amplifier, wherein the measurement signal from the current transformer and the zero crossing signal applied to the inputs of said Sample and Hold amplifier, and wherein a correction value is applied as the output signal, said correction value fed to the positive input of an operational amplifier, and wherein the measurement signal is applied to the negative input of the operational amplifier.

15. The measuring device as claimed in claim 14, wherein the measurement signal is applied to the negative input of the operational amplifier such that the corrected measurement output signal is tapped off at the output of the operational amplifier.

16. The measuring device as claimed in claim 11, wherein the feeding of DC current components, which disturb the quality of the AC mains power system, is prevented.

* * * * *